(12) United States Patent
Putz (10) Patent No.: US 10,502,778 B2
(45) Date of Patent: Dec. 10, 2019

(54) METHOD AND APPARATUS FOR ELECTRIC ARC DETECTION

(71) Applicant: SMA Solar Technology AG, Niestetal (DE)

(72) Inventor: Martin Putz, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 921 days.

(21) Appl. No.: 14/978,193

(22) Filed: Dec. 22, 2015

(65) Prior Publication Data

US 2016/0116524 A1    Apr. 28, 2016

Related U.S. Application Data

(63) Continuation of application No. PCT/EP2014/060358, filed on May 20, 2014.

(30) Foreign Application Priority Data

Jun. 26, 2013   (DE) ........................ 10 2013 106 702

(51) Int. Cl.
   *G01R 19/00*   (2006.01)
   *G01R 31/28*   (2006.01)
   (Continued)

(52) U.S. Cl.
   CPC ....... *G01R 31/2832* (2013.01); *G01R 15/185* (2013.01); *G01R 19/0015* (2013.01);
   (Continued)

(58) Field of Classification Search
   CPC .............. G01R 15/185; G01R 19/0015; G01R 19/0046
   (Continued)

(56) References Cited

U.S. PATENT DOCUMENTS 3,496,407 A * 2/1970 Entenmann ......... H03F 3/45475
                                                  315/387
4,293,812 A * 10/1981 Kubach ................... H02M 3/10
                                                  323/272
(Continued)

FOREIGN PATENT DOCUMENTS

JP    2011223667 A    11/2011
WO    2008031491 A1    3/2008
WO    2011127982 A1   10/2011

OTHER PUBLICATIONS

International Search Report, PCT/EP2014/060358, dated Oct. 9, 2014.
(Continued)

*Primary Examiner* — Patrick Assouad
*Assistant Examiner* — Demetrius R Pretlow
(74) *Attorney, Agent, or Firm* — Eschweiler & Potashnik, LLC (57) ABSTRACT

A method for detecting high-frequency AC currents in a DC circuit including a common mode choke with two partial windings includes tapping voltages dropping across the two partial windings due to the AC current, superposing the tapped voltages, and obtaining a superposed AC voltage wherein differential mode portions of the tapped voltages are summed constructively and common mode portions of the voltages are summed destructively; and measuring the superposed AC voltage.

20 Claims, 3 Drawing Sheets

(51) Int. Cl.
  *G01R 15/18* (2006.01)
  *H02M 5/42* (2006.01)
  *H02H 1/00* (2006.01)
  *H02J 1/02* (2006.01)
  *G01R 31/12* (2006.01)
(52) U.S. Cl.
  CPC .......... *G01R 19/0046* (2013.01); *H02M 5/42* (2013.01); *G01R 31/12* (2013.01); *H02H 1/0015* (2013.01); *H02J 1/02* (2013.01)
(58) Field of Classification Search
  USPC .................................................. 324/537, 536
  See application file for complete search history.

(56) References Cited

U.S. PATENT DOCUMENTS

| | | | | |
|---|---|---|---|---|
| 4,507,721 | A * | 3/1985 | Yamano | H02M 3/335 363/20 |
| 5,136,455 | A * | 8/1992 | Billingsley | H02H 9/005 361/111 |
| 7,132,812 | B1 * | 11/2006 | Wu | H01F 27/28 318/448 |
| 7,812,693 | B1 * | 10/2010 | Acimovic | H01P 3/02 333/12 |
| 2002/0117318 | A1 * | 8/2002 | Suzuki | H01R 13/7197 174/51 |
| 2003/0117123 | A1 * | 6/2003 | Kimball | G01R 19/0092 324/76.41 |
| 2004/0240236 | A1 | 12/2004 | Lanni | |
| 2009/0027937 | A1 * | 1/2009 | Kirchmeier | H01J 37/32045 363/133 |
| 2009/0224735 | A1 | 9/2009 | Tsutsumi et al. | |
| 2014/0084790 | A1 * | 3/2014 | Won | H05K 9/00 315/85 |
| 2016/0372927 | A1 * | 12/2016 | Dent | H01L 31/0504 |
| 2018/0366261 | A1 * | 12/2018 | Bergquist | H02M 7/5387 |

OTHER PUBLICATIONS

Yuang-Shung, Lee et al. "EMI performance comparison of switched-capacitor bidirectional converter with and without QR ZCS." Power Electronics and Drive Systems, 2009, PEDS 2009, International Conference on, IEEE, Piscataway, NJ, USA, Jan. 2, 2009.

* cited by examiner

METHOD AND APPARATUS FOR ELECTRIC ARC DETECTION

CROSS REFERENCE TO RELATED APPLICATIONS

This application claims priority to International Patent Application number PCT/EP2014/060358, filed on May 20, 2014, which claims priority to German Patent Application number 10 2013 106 702.6, filed on Jun. 26, 2013, and is hereby incorporated in its entirety.

FIELD

The disclosure relates to a method and an apparatus for detecting high-frequency AC currents, in particular for detecting electric arcs, in a DC circuit comprising a common mode choke with two partial windings.

BACKGROUND

An electric arc occurring in a direct current (DC) circuit may be recognized by detecting high-frequency alternating currents (AC) within the DC circuit which are symptomatic for an electric arc.

For the detection of AC currents in a DC circuit, several types of sensors are known. Examples of such sensors are winding type transformers, e.g. so-called Rogowski coils, or shunt resistors, at which a voltage drop may be measured if an AC current occurs. When using such sensors it is usually necessary to modify the construction of the DC circuit. For example, when using a winding type transformer, a DC conductor has to be fed through the winding type transformer, or when using a shunt resistor, it has to be placed within the DC circuit appropriately and additionally causes an increase of power losses within the DC circuit.

DC circuits may be sensitive to external electromagnetic fields or may be connected to devices which generate AC current components, e.g. power converters comprising high-frequency switching devices, and may even generate and emit electromagnetic fields themselves. In order to comply with electromagnetic compatibility (EMC) regulations, such DC circuits often comprise filters which suppress unwanted AC content from the currents flowing within the DC circuit in order to attenuate electromagnetic radiation emitted by the DC circuit. In particular, a common mode choke is often used to suppress AC currents flowing in the same direction through the positive and negative conductors of the DC circuits, i.e. so-called common mode currents. Such a common mode choke comprises at least two partial windings which are wound on a common core and which are connected to the positive and the negative conductors of the DC circuit, respectively. Such a common mode choke has a high inductance for common mode currents, i.e. for AC currents flowing in the same direction through conductors of the DC circuits which are arranged substantially parallel and in which a DC current flows in opposite directions. On the other hand, a common mode choke has a very low inductance for differential mode currents, i.e. currents flowing in opposite directions through the conductors of the DC circuit, hence the common mode choke has a negligible effect on the DC current and differential mode AC currents flowing parallel or antiparallel to the DC currents.

SUMMARY

The present disclosure is directed to a method and an apparatus for detecting high-frequency AC currents in a DC circuit, in particular differential mode AC currents, without using an AC current sensor within the DC circuit, in particular without an AC current sensor which requires an interruption of the DC conductors for being mounted or which increases power losses within the DC circuit.

According to one embodiment of the disclosure, a method for detecting high-frequency AC currents in a DC circuit comprising a common mode choke with two partial windings comprises tapping voltages dropping across the two partial windings due to the AC current, and superposing the tapped voltages and obtaining a superposed AC voltage using a superposition circuit. The differential mode portions of the tapped voltages are summed constructively and common mode portions of the voltages are summed destructively by the superposition circuit, and the superposed AC voltage is measured using a voltage sensing device.

The inductance of a common mode choke for differential mode currents is not zero, but has a certain small value due to the construction of the common more choke. This inductance for differential mode currents is called leakage inductance and is mainly based on a coupling factor between the windings of the common mode choke. The coupling factor may be varied or adjusted by modifying the design of the common mode choke. For example, the windings of the common mode choke may purposefully be designed differently with respect to an area of overlap with the core of the common mode choke or with respect to a diameter of the respective winding space such that a percentage of a magnetic leakage flux relative to an overall magnetic flux is controlled. Alternatively, the core of the common mode choke may comprise a specific geometry, air gaps, selective deformations, or areas with different magnetic permeability.

Due to the leakage inductance of the common mode choke, the windings of the common mode core comprise an electric impedance which depends on the frequency of the current flowing through the windings and which increases with increasing frequency. Hence an AC voltage drops across each of the partial windings of the common mode choke if an AC current is flowing through the partial windings. This AC voltage may be tapped and comprises components due to common mode currents for which the common mode choke has a high inductance by design even at low frequencies, as well as components due to high-frequency differential mode currents which are of particular interest with regard to this disclosure. These different components of the voltage dropping across an individual partial winding of the common mode choke are not distinguishable from each other. Furthermore, due to the comparably small leakage inductance of the common mode choke, the voltage drops induced by the differential mode currents have much smaller amplitudes than the voltage drops induced by the common mode currents.

On the other hand, the different components of the voltages dropping across the individual partial windings of the common mode choke due to common mode currents or differential mode currents, respectively, comprise different phase angles relative to each other, i.e. they are in phase or inversely phased, respectively, with respect to the individual partial windings. Since the tapped voltages dropping across the two partial windings of the common mode choke are superposed, according to this disclosure, such that differential mode portions of the tapped voltages are summed constructively, the common mode portions of the tapped voltages are summed destructively inherently. Hence, the superposed AC voltage thus obtained essentially solely represents the high-frequency differential mode AC currents of interest within this disclosure and may be used as a measure for this high-frequency differential mode AC current.

In an embodiment of the method, the superposing of the tapped voltages comprises amplifying the tapped voltages by differential amplifiers and summing the output signals of the differential amplifiers. The differential amplifiers may comprise equal amplification factors in one embodiment, and the summing of their output signals is performed in proper phase relation, i.e. such that the differential mode components of the tapped voltages are in phase. As a subsequent step, an analog or digital evaluation of the superposed AC voltage with respect to AC currents originating from electric arcs may be implemented.

In an alternative embodiment of the method, the superposing of the tapped voltages comprises digitizing the tapped voltages by analog-digital converters and summing the thus digitized voltages. The digitization is performed at an adequately high sampling rate for the high-frequency AC currents of interest, and the summing comprises applying an appropriate sign to the tapped voltages such that the superposed voltages represent the differential mode AC currents of interest. These digitized voltages may be evaluated with respect to their effective values or with respect to their spectral content as a measure for the high-frequency differential mode AC currents of interest.

In an alternative embodiment of the method, the superposing of the tapped voltages comprises applying the tapped voltage dropping across a first partial winding of the common mode choke to the inputs of a differential amplifier and connecting a first end of the second partial winding of the common mode choke to a reference potential of an output of the differential amplifier, wherein a voltage dropping between the output of the differential amplifier and a second end of the second partial winding of the common mode choke is the superposed AC voltage. The differential amplifier may comprise an amplification factor of one in one embodiment, and the superposed AC voltage may be evaluated with respect to AC currents originating from an electric arc.

In an alternative embodiment of the method, the superposing of the tapped voltages comprises connecting tapping paths each comprising a winding of a transformer in parallel to each partial winding of the common mode choke. In each of the tapping paths, an element which prevents short-circuiting of the respective partial winding of the common mode choke or which keeps off DC currents from the transformer may be connected in series with the respective winding of the transformer. Such element may be a capacitor or a voltage measurement device, e.g. a voltmeter comprising an adequately high internal resistance. In case of a capacitor connected in series with the respective winding of the transformer, this capacitor and the respective winding of the transformer form a series resonance circuit with a resonance frequency which may be tuned such the operation of common mode choke as an EMC filter is not disturbed and the detection of the high-frequency AC currents of interest is not impeded.

In a further embodiment of the method, the windings of the transformer within the tapping paths are provided as a primary side winding and a secondary side winding of a common transformer, respectively, wherein the capacitor is arranged in series with the primary side winding and the voltage measurement device is arranged in series with the secondary side winding of the transformer. A further capacitor may be arranged in series with the voltage measurement device. In this embodiment, the voltage measurement device measures the particular voltage dropping across the particular partial winding of the common mode choke to which the particular tapping path comprising the voltage measurement device is connected to, as well as the voltage dropping across the other partial winding of the common mode choke which is added in proper phase relation to the voltage dropping across the aforementioned particular partial winding.

In an alternative embodiment of the method, the windings of the transformer within the tapping paths are provided as primary side windings of a common transformer which comprises a single secondary side winding. The voltage dropping across the single secondary winding is the superposed voltage AC voltage of interest and may be detected.

In another alternative embodiment of the method, the windings of the transformer within the tapping paths are provided as primary side windings of individual transformers which each comprise a secondary side winding, wherein the secondary side windings of the individual transformers are connected in series in proper phase relation. Due to the serial connection of the secondary side windings, the voltages dropping across the partial windings of the common mode choke are summed and may be measured as the superposed AC voltage.

Using the windings of transformer within the tapping paths and measuring the superposed AC at the secondary winding or the secondary windings, respectively, according to the respective embodiments as described above provides a galvanic isolation between the measurement of the superposed AC voltage and the partial windings of the common mode choke.

In an embodiment of the method, the measured superposed AC voltage is compared with a threshold value and an electric arc is indicated if the measured superposed AC voltage exceeds the threshold value. Such comparison may be performed continuously, and appropriate measures may be taken if an electric arc is indicated, e.g. measures to extinguish the arc or shutting down operation of the DC circuit.

An apparatus according to one embodiment of the disclosure for detecting high-frequency AC currents in a DC circuit comprising a common mode choke with two partial windings comprises tapping circuits configured to tap voltages dropping across the two partial windings, and a superposition circuit configured to superpose the tapped voltages. The differential mode portions of the tapped voltages are summed constructively and common mode portions of the voltages are summed destructively, and a superposed AC voltage is obtained. The apparatus further comprises a measurement device configured to measure the superposed AC voltage.

In an embodiment of the apparatus, the tapping circuits each comprise a differential amplifier and the superposition circuit comprises summing units configured to sum output signals of the differential amplifiers.

In an alternative embodiment of the apparatus, the tapping circuits each comprise a digital-analog converter and the superposition circuit comprises a summing circuit configured to sum output signals of the digital-analog converters.

In another alternative embodiment of the apparatus, the tapping circuits are arranged such that the voltage dropping across a first partial winding of the common mode choke is applied to the inputs of a differential amplifier. A first end of a second partial winding of the common mode choke is connected to a reference potential of an output of the differential amplifier, and the measurement devices are configured to measure the superposed AC voltage between the output of the differential amplifier and a second end of the second partial winding of the common mode choke.

In another alternative embodiment of the apparatus, the tapping circuits for each of the partial windings comprise a tapping path which is arranged in parallel to the respective partial winding, and the superposition circuit comprises a winding of a transformer arranged in each of the tapping paths. Additionally, the tapping paths may comprise elements which prevent short-circuiting of the respective partial winding or which keep off DC currents from the transformer. Such element may be a capacitor or a voltage measurement device, e.g. a voltmeter comprising an adequately high internal resistance.

In an embodiment of the apparatus, the windings in the tapping paths are a primary side winding and a secondary side winding of a common transformer, wherein the capacitor is arranged in series with the primary side winding and the voltage measurement device is arranged in series with the secondary side winding of the common transformer.

In an alternative embodiment of the apparatus, the windings in the tapping paths are primary side windings of a common transformer which comprises a single secondary side winding, wherein the measurement devices are configured to measure the superposed AC voltage dropping across the secondary side winding of the common transformer. As an alternative, the windings arranged in the tapping paths are primary side windings of individual transformers which each comprise a secondary side winding, wherein the secondary side windings of the individual transformers are connected in series and the measurement device is configured to measure the superposed AC voltage dropping across the serial connection of the secondary side windings.

In an embodiment of the apparatus, the apparatus further comprises a comparison circuit configured to compare the superposed AC voltage with at least one threshold value, and a signaling device configured to output a signal indicating an electric arc if the superposed AC voltage exceeds the at least one threshold.

According to the disclosure, the measured superposed AC voltage is not simply representing AC currents of arbitrary direction and arbitrary frequency flowing in the DC circuit. Rather, since the leakage inductance of the common mode choke is only effective for high-frequency AC currents and due to the specific phase relation applied during superposing the tapped voltages dropping across the partial windings of the common mode choke, the measured superposed AC voltage represents high-frequency differential mode AC currents only. Since these high-frequency differential mode AC currents may directly indicate the occurrence of an electric arc within the DC circuit, there is no need for laborious signal processing, but a simple comparison of e.g. an effective value of the measured superposed AC voltage with a corresponding threshold may be sufficient in order to analyze the measured superposed AC voltage with regard to an electric arc signal. Such threshold may be set depending on the actual leakage inductance of the common mode choke in use or may be determined empirically based on a test signal with known frequency and amplitude. Furthermore, unwanted AC voltage components originating from common mode currents which are not summed destructively due to possible asymmetries of the common mode choke may be minimized by scaling the voltages dropping across the partial windings of the common mode choke individually with different scaling factors which may also be determined using said test signal.

BRIEF DESCRIPTION OF THE DRAWINGS

The disclosure will be explained in more detail below with reference to example embodiments with the aid of figures, in which.

DETAILED DESCRIPTION

Figure 1:
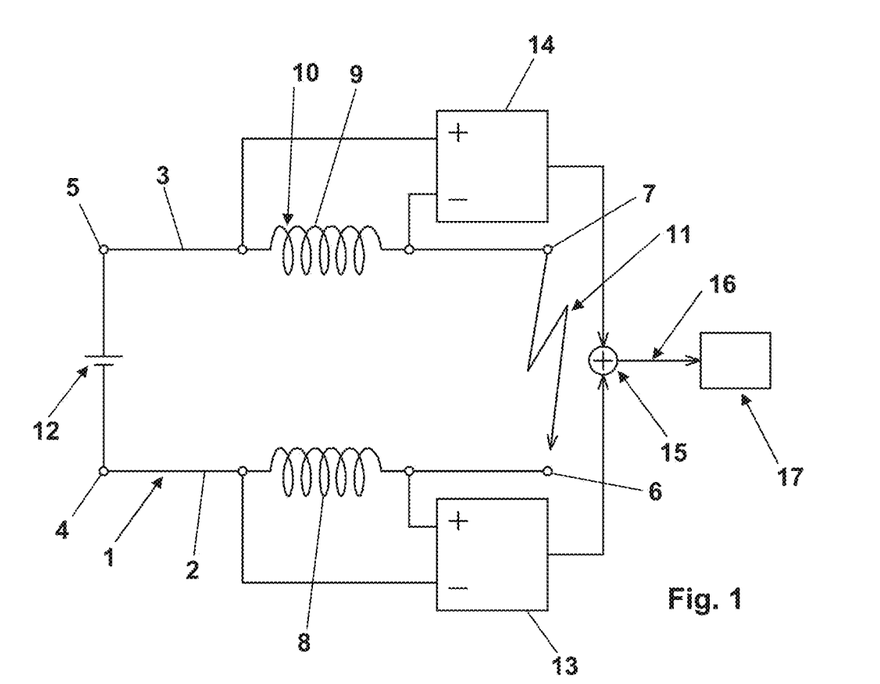
FIG. 1 shows a DC circuit comprising a common mode choke and an apparatus according to one embodiment of the present disclosure.

FIG. 1 shows a DC circuit 1 comprising two conductors 2 and 3 which run from terminals 4 and 5 to terminals 6 and 7, respectively. Partial windings 8 and 9 of a common mode choke 10 are arranged within or along the conductors 2 and 3, respectively. The common mode choke 10 possesses a high impedance for common mode currents flowing from the terminals 4 and 5 to the terminals 6 and 7, respectively, and a frequency-depending impedance for differential mode currents, which is insignificantly low for low-frequency differential mode AC currents and particularly negligible for a DC current flowing within the DC circuit 1. Due to its inevitable leakage inductance, the impedance of the common mode choke 10 for high-frequency differential mode currents is noticeable and will be purposefully facilitated according to this disclosure.

For example, if an electric arc 11 occurs between the terminals 6 and 7 which is fed by a voltage source 12 arranged between the terminals 4 and 5, the current flowing in the DC circuit 1 is not a pure DC current but rather comprises distinct high-frequency AC current components. These high-frequency AC current components yield to voltages dropping across the partial windings 8 and 9 of the common mode choke 10 which are, as such, indistinguishable from voltages dropping across the partial winding 8 and 9 due to common mode currents or other reasons not related to the electric arc 11. If the voltages dropping across the partial windings 8 and 9 are superposed such that those voltage components which are based on the differential mode currents within the DC circuit 1 are summed constructively, then, at the same time, all other voltage components based on common mode currents are summed destructively. Hence, a superposed AC voltage 16 representing the high-frequency differential mode AC current generated by the electric arc 11 may be obtained by purposefully summing the AC voltages dropping across the partial windings 8 and 9 using an appropriate phase relation with respect to each other.

According to FIG. 1, analog-digital (A/D) converters 13 and 14 are provided for digitizing the voltages dropping across the partial windings 8 and 9, respectively. A summing unit 15 sums the digitized voltages using an appropriate phase relation and outputs the superposed AC voltage 16 which is subsequently compared to a threshold within a comparison unit 17 such that the presence of an electric arc is indicated if the superposed AC voltage 16 exceeds the threshold.

In a slightly modified embodiment, the A/D converters 13 and 14 according to FIG. 1 may be replaced by differential amplifiers comprising equal amplification factors for the voltages dropping across the partial windings 8 and 9. In this embodiment, the summing unit 15 sums the thus amplified voltages in the same properly phased manner as described above and outputs a superposed AC voltage 16 to the comparison unit 17 which may comprise analog as well as digital evaluation units, e.g. demodulation circuitry, further A/D converters, or signal processing units. Within the comparison unit 17, the superposed AC voltage 16 is compared to a threshold such that the presence of an electric arc may be indicated if the superposed AC voltage 16 exceeds the threshold.

Figure 2:
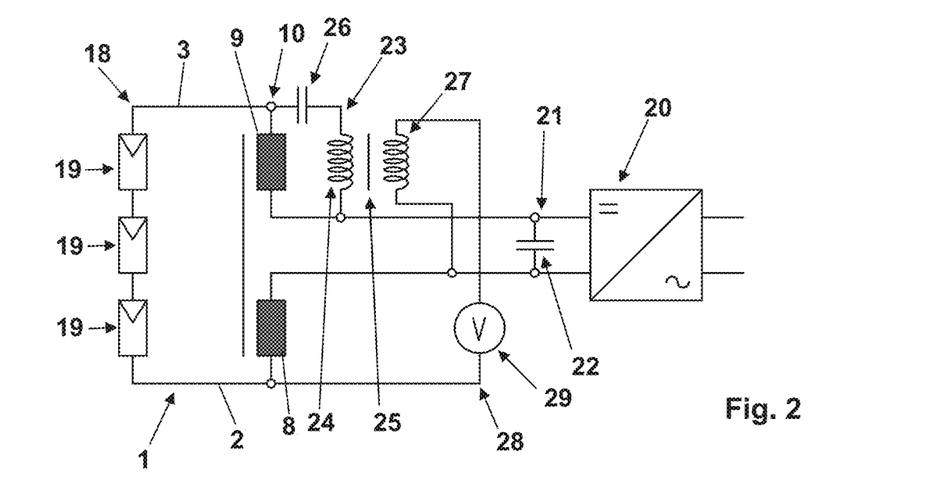
FIG. 2 shows a DC circuit arranged between a photovoltaic generator and an inverter and comprising a common mode choke and an apparatus according to one embodiment of the present disclosure.

FIG. 2 shows the DC circuit 1 being arranged between a photovoltaic (PV) generator 18 comprising a plurality of PV modules connected in series and an inverter 20 which is configured to e.g. feed electric power into an alternating current grid (not shown). The inverter 20 comprises a DC link circuit 21 with a DC link capacitor 22. The common mode choke 10 is facilitated as an EMC filter between the PV generator 18 and the inverter 20 and is arranged such that a first partial winding 8 is connected to conductor 2 and a second partial winding 9 is connected to conductor 3.

A tapping path 23 comprising a serial connection of a primary side winding 24 of a transformer 25 and a capacitor 26 is arranged in parallel to the second partial winding 9 of the common mode choke 10. The capacitor 26 prevents the second partial winding 9 from being short-circuited by the tapping path 23. The transformer 25 transfers a voltage dropping across the second partial winding 9 of the common mode choke 10 onto the secondary side winding 27 of the transformer 25.

Another tapping path 28 comprising a serial connection of a secondary side winding 27 of the transformer 25 and a voltmeter 29 is arranged in parallel with the first partial winding 8 of the common mode choke 10. The voltmeter 29 measures a superposed AC voltage that comprises a sum of the voltage dropping across the first partial winding 8 of the common mode choke 10 and the voltage dropping across the second partial winding 9 of the common mode choke 10, wherein the latter voltage is added to the first voltage in proper phase relation by means of the transformer 25 such that voltage components originating from differential mode AC currents flowing within the DC circuit 1 are summed constructively.

Figure 3:
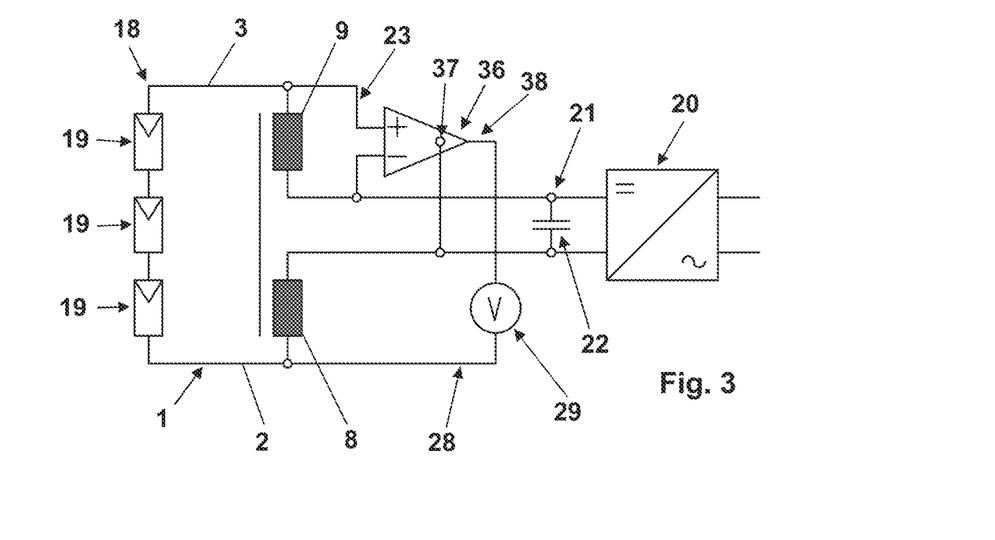
FIG. 3 shows a DC circuit arranged between a photovoltaic generator and an inverter and comprising a common mode choke and an apparatus according to an alternative embodiment of the present disclosure.

FIG. 3 shows an embodiment of the apparatus according to the disclosure with a DC circuit 1 substantially identical with the DC circuit 1 according to FIG. 2. In FIG. 3, the transformer 25 according to FIG. 2 is replaced by a differential amplifier 36 which may comprise an input with high impedance such that the differential amplifier 36 may be arranged within the tapping path 23 connected with the second partial winding 9 without the need for the capacitor 26 according to FIG. 2.

The tapping path 28 which is connected to the first partial winding 8 of the common mode choke 10 comprises a serial connection of the differential amplifier 36 and the voltmeter 29, wherein one end of the first partial winding 8 is connected with a reference potential 37 of the differential amplifier 36 and the other end of the first partial winding 8 is connected to the output 38 of the differential amplifier 36 via the voltmeter 29.

The differential amplifier 36 comprises an amplification factor of one if the common mode choke 10 is set up symmetrically, i.e. if the partial windings 8 and 9 of the common mode choke 10 are substantially identical. This is advantageous to provide a substantially complete cancellation of unwanted AC voltage components originating from voltages dropping across the partial windings 8 and 9 caused by common mode currents flowing within the DC circuit 1. For the same reason, in one embodiment it is desired that the turns ratio of the primary side winding 23 and the secondary side winding 27 of the transformer 25 according to FIG. 2 be one. On the other hand, an amplification factor or a turns ratio, respectively, with a value beyond one may be purposefully selected in order to compensate for known asymmetries, e.g. for differences between the partial windings 8 and 9, such that the voltmeter 29 actually detects high-frequency AC voltages originating from differential mode currents only.

Figure 4:
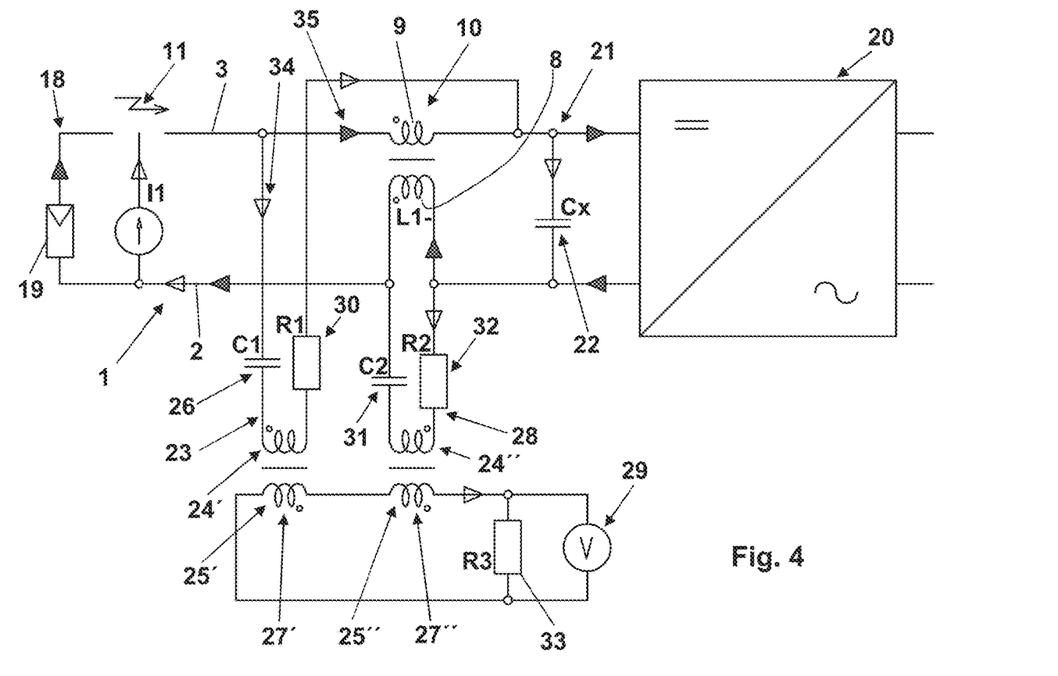
FIG. 4 shows a DC circuit arranged between a photovoltaic generator and an inverter and comprising a common mode choke and an apparatus according to another embodiment of the present disclosure.

FIG. 4 shows the DC circuit 1 being arranged between the PV generator 19 and the inverter 20 wherein the partial windings 8 and 9 of the common mode choke 10 are arranged in series with the conductors 2 and 3, respectively. The tapping path 23 is arranged in parallel to the second partial winding 9 of the common mode choke 10 and comprises a series connection of a primary side winding 24' of a first transformer 25', a capacitor 26, and a damping resistor 30. The tapping path 28 is arranged in parallel to the first partial winding 8 of the common mode choke 10 and comprises a series connection of a primary side winding 24" of a second transformer 25", a capacitor 31, and a damping resistor 32. Secondary side windings 27' and 27" of the transformers 25' and 25", respectively, are arranged in series connection, and a voltage dropping across the series connection of the secondary side windings 27' and 27" is measured by a voltmeter 29. An optional resistor 33 may be arranged in parallel to the voltmeter 29. The measurement of the superposed AC voltage takes place with complete galvanic isolation from the conductors 2 and 3.

In FIG. 4, an electric arc 11 in the conductor 3 is shown. The electric arc 11 generates a high-frequency differential mode AC current which flows through the common mode choke 10 and is indicated by the voltmeter 29. Empty arrow heads 34 symbolize that the high-frequency differential mode AC current may flow through the tapping paths 23 and 28 and hence may be measured by the voltmeter 29 after being transformed and superposed in proper phase relation by the arrangement of the transformer 25' and 25". On the other hand, the DC current flowing through the DC circuit 1 is blocked from flowing through the tapping paths 23 and 28 by the capacitors 26 and 31, respectively, and takes the standard path through the partial windings 8 and 9 of the common mode choke 10 as symbolized by full arrow heads 35 in FIG. 4.

Figure 5:
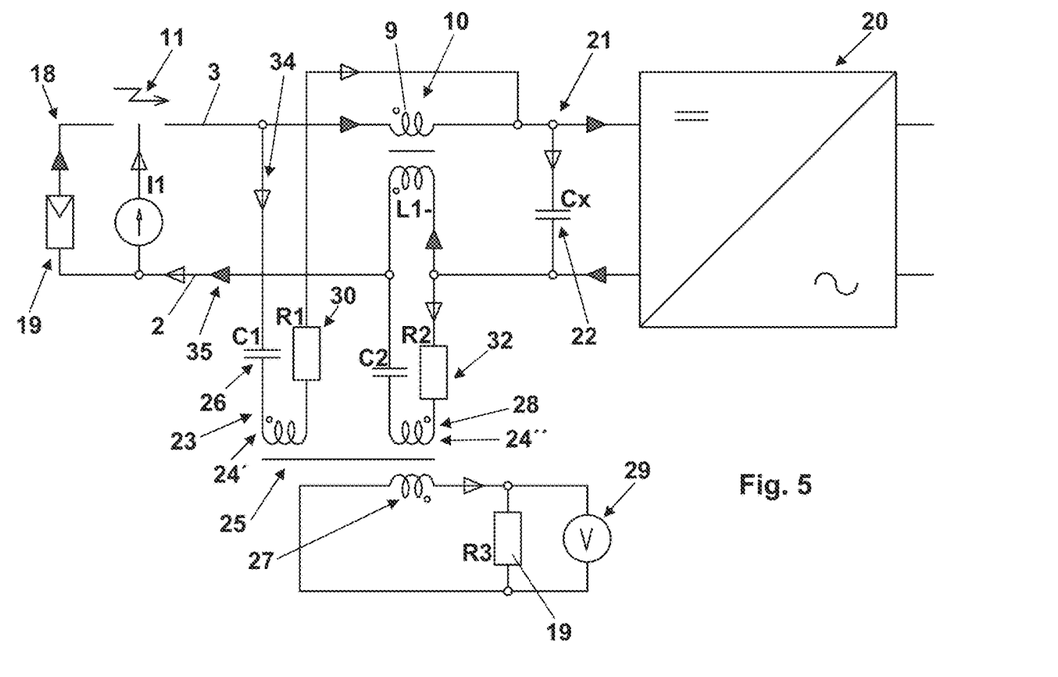
FIG. 5 shows a DC circuit arranged between a photovoltaic generator and an inverter and comprising a common mode choke and an apparatus according to a further embodiment of the present disclosure.

FIG. 5 shows a further embodiment of an apparatus according to the disclosure. In FIG. 5, the series arrangement of the transformers 25' and 25" according to FIG. 4 is replaced by a common transformer 25 comprising two primary side windings 24' and 24" which are arranged in the tapping paths 23 and 28, respectively, and comprising a single secondary side winding 27. The AC voltage dropping across the secondary side winding 27 is correlated with the sum of the voltages dropping across the partial windings 8 and 9 of the common mode choke 10 and provides the superposed AC voltage representing the high-frequency differential mode AC current of interest.

In some embodiments according to the disclosure, the common mode choke 10 and the apparatus according to the disclosure for detecting high-frequency AC currents in the DC circuit 1 may be arranged within the same casing as the inverter 20 or at least nearby the inverter 20. The PV generator 18 may be located quite remote from an apparatus according to disclosure; nevertheless, an electric arc occurring in the area of the PV generator 18 may be detected reliable using an apparatus or a method according to the disclosure.

The invention claimed is:

1. A method for detecting high-frequency AC currents in a DC circuit comprising a common mode choke with two partial windings, comprising:
   tapping voltages dropping across the two partial windings due to the AC current;
   superposing the tapped voltages and obtaining a superposed AC voltage using a superposition circuit, wherein differential mode portions of the tapped voltages are summed constructively and common mode portions of the tapped voltages are summed destructively; and
   measuring the superposed AC voltage using a voltage sensing device.

2. The method according to claim 1, wherein the superposing of the tapped voltages using a superposition circuit comprises amplifying the tapped voltages by differential amplifiers and summing the output signals of the differential amplifiers.

3. The method according to claim 1, wherein the superposing of the tapped voltages comprises digitizing the tapped voltages by analog-digital converters and summing the thus digitized voltages.

4. The method according to claim 1, wherein the superposing of the tapped voltages using a superposition circuit comprises:
   applying the tapped voltage dropping across a first partial winding of the common mode choke to the inputs of a differential amplifier; and
   connecting a first end of the second partial winding of the common mode choke to a reference potential of an output of the differential amplifier,
   wherein a voltage dropping between the output of the differential amplifier and a second end of the second partial winding of the common mode choke is the superposed AC voltage.

5. The method according to claim 1, wherein the superposing of the tapped voltages using a superposition circuit comprises connecting a tapping path comprising a winding of a transformer in parallel to each partial winding of the common mode choke.

6. The method according to claim 5, wherein the superposing of AC voltage portions of the tapped voltages using a superposition circuit comprises connecting a capacitor or a voltage measurement device in series with the windings of the transformer in each of the tapping paths.

7. The method according to claim 6, wherein the superposing of the tapped voltages using a superposition circuit comprises providing the windings of the transformer within the tapping paths as a primary side winding and a secondary side winding of a common transformer, and arranging the capacitor in series with the primary side winding and the voltage measurement device in series with the secondary side winding of the transformer.

8. The method according to claim 5, wherein the superposing of the tapped voltages using a superposition circuit comprises providing the windings within the tapping paths as primary side windings of a common transformer which comprises a single secondary side winding.

9. The method according to claim 5, wherein the superposing of the tapped voltages using a superposition circuit comprises providing the windings within the tapping paths as primary side windings of individual transformers which each comprise a secondary side winding, wherein the secondary side windings of the individual transformers are connected in series.

10. The method according to claim 1, further comprising:
    comparing the measured superposed AC voltage with a threshold value; and
    indicating a presence of an electric arc if the measured superposed AC voltage exceeds the threshold value.

11. An apparatus for detecting high-frequency AC currents in a DC circuit comprising a common mode choke with two partial windings, the apparatus comprising:
    tapping circuits configured to tap voltages dropping across the two partial windings;
    a superposition circuit configured to superpose the tapped voltages, wherein differential mode portions of the tapped voltages are summed constructively and common mode portions of the voltages are summed destructively, and a superposed AC voltage is obtained at an output thereof; and
    a measurement device coupled to the output of the superposition circuit and configured to measure the superposed AC voltage.

12. The apparatus according to claim 11, wherein the tapping circuits each comprise a differential amplifier and the superposition circuit comprises a summing circuit configured to sum output signals of the differential amplifiers.

13. The apparatus according to claim 11, wherein the tapping circuits each comprise a analog-digital converter and the superposition circuit comprises a summing circuit configured to sum output signals of the analog-digital converters.

14. The apparatus according to claim 11, wherein the tapping circuits are arranged such that a voltage dropping across a first partial winding of the common mode choke is applied to the inputs of a differential amplifier, and wherein a first end of a second partial winding of the common mode choke is connected to a reference potential of an output of the differential amplifier, and wherein the measurement devices are configured to measure the superposed AC voltage between the output of the differential amplifier and a second end of the second partial winding of the common mode choke.

15. The apparatus according to claim 11, wherein the tapping circuits for each of the partial windings comprise a tapping path arranged in parallel to the respective partial winding, and wherein the superposition circuit comprises a winding of a transformer arranged in each of the tapping paths.

16. The apparatus according to claim 15, wherein a capacitor or a voltage measurement device is arranged in series with the winding of the transformer in each of the tapping paths.

17. The apparatus according to claim 16, wherein the windings in the tapping paths are a primary side winding and a secondary side winding of a common transformer, wherein the capacitor is arranged in series with the primary side winding and the voltage measurement device is arranged in series with the secondary side winding of the common transformer.

18. The apparatus according to claim 15, wherein the windings in the tapping paths are primary side windings of a common transformer which comprises a single secondary side winding, wherein the measurement devices are configured to measure the superposed AC voltage dropping across the secondary side winding.

19. The apparatus according to claim 15, wherein the windings in the tapping paths are primary side windings of individual transformers which each comprise a secondary side winding, wherein the secondary side windings are connected in series and the measurement devices are configured to measure the superposed AC voltage dropping across the serial connection of the secondary side windings.

20. The apparatus according to claim 11, further comprising:
 a comparison circuit configured to compare the superposed AC voltage with at least one threshold value; and
a signaling device configured to output a signal indicating an electric arc if the superposed AC voltage exceeds the at least one threshold.

\* \* \* \* \*